United States Patent (12) United States Patent
Tsukahara et al.

(10) Patent No.: US 9,770,907 B2
(45) Date of Patent: Sep. 26, 2017

(54) MEMS DEVICE, LIQUID EJECTING HEAD, AND LIQUID EJECTING APPARATUS (71) Applicant: SEIKO EPSON CORPORATION, Tokyo (JP)

(72) Inventors: Katsutomo Tsukahara, Shiojiri (JP); Motoki Takabe, Shiojiri (JP); Eiju Hirai, Azumino (JP); Masao Nakayama, Shiojiri (JP); Munehide Saimen, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/354,851

(22) Filed: Nov. 17, 2016

(65) Prior Publication Data
US 2017/0144442 A1 May 25, 2017

(30) Foreign Application Priority Data

Nov. 24, 2015 (JP) ................. 2015-228459

(51) Int. Cl.
*B41J 2/045* (2006.01)
*B41J 2/14* (2006.01)
*B81B 7/00* (2006.01)

(52) U.S. Cl.
CPC ......... *B41J 2/14201* (2013.01); *B81B 7/0061* (2013.01); *B81B 2201/052* (2013.01)

(58) Field of Classification Search
CPC .......... B41J 2/14274; B41J 2002/14258; B41J 2/14233

(Continued)

(56) References Cited

U.S. PATENT DOCUMENTS 8,596,767 B2 * 12/2013 Miyata ................. B41J 2/14233
347/68
2004/0113994 A1 6/2004 Shinkai
(Continued)

FOREIGN PATENT DOCUMENTS

EP 1403050 3/2004
EP 1632354 3/2006
(Continued)

*Primary Examiner* — An Do
(74) *Attorney, Agent, or Firm* — Workman Nydegger (57) ABSTRACT A MEMS device includes a drive region having a stacked structural body in which a first electrode layer, a first dielectric layer, and a second electrode layer are stacked in that order. The stacked structural body extends from the drive region to a non-drive region that is outer than the drive region and, in an extending direction of the stacked structural body, the first electrode layer and the first dielectric layer extend farther outward than the second electrode layer. A second dielectric layer covering an end of the second electrode layer in the extending direction is stacked on the second electrode layer in the non-drive region and the first dielectric layer that is formed outer in the extending direction than the second electrode layer. A third electrode layer electrically connected to the second electrode layer is stacked on the second dielectric layer and on the second electrode layer in a region outside the second dielectric layer. In the extending direction, the end of the second electrode layer is formed more to a drive region side than a second dielectric layer-side end of the third electrode layer.

6 Claims, 6 Drawing Sheets (58) Field of Classification Search
USPC .............................................. 347/68, 70–72
See application file for complete search history.

(56) References Cited

U.S. PATENT DOCUMENTS

| | | |
|---|---|---|
| 2007/0159511 A1 | 7/2007 | Shinkai |
| 2010/0208007 A1 | 8/2010 | Nihei |
| 2016/0271948 A1* | 9/2016 | Hamaguchi .......... B41J 2/14233 |
| 2017/0066241 A1* | 3/2017 | Naganuma ........... B41J 2/14233 |

FOREIGN PATENT DOCUMENTS

| | | |
|---|---|---|
| JP | 2004-136663 | 5/2004 |
| JP | 2010-192721 | 9/2010 |
| JP | 2012-106386 | 6/2012 |

* cited by examiner

MEMS DEVICE, LIQUID EJECTING HEAD, AND LIQUID EJECTING APPARATUS

The entire disclosure of Japanese Patent Application No: 2015-228459, filed Nov. 24, 2015 is expressly incorporated by reference herein in its entirety.

BACKGROUND

1. Technical Field

The invention relates to a micro-electro-mechanical system (MEMS) device, a liquid ejecting head, and a liquid ejecting apparatus for use for ejecting a liquid. Particularly, the invention relates to a MEMS device, a liquid ejecting head, and a liquid ejecting apparatus that each include a stacked structural body in which a first electrode layer, a dielectric layer, and a second electrode layer are sequentially stacked.

2. Related Art

MEMS devices that have a stacked structural body in which a first electrode layer, a dielectric layer, and a second electrode layer are sequentially stacked are applied in various apparatuses (e.g., liquid ejecting apparatuses, sensors, etc.). For example, a liquid ejecting head that is a kind of MEMS device is provided with a piezoelectric element that is a kind of the foregoing stacked structural body, a nozzle that ejects a liquid, a pressure chamber that communicates with the nozzle, etc. The liquid ejecting apparatuses in which a liquid ejecting head as described above is mounted include, for example, image recording apparatuses, such as ink jet type printers and ink jet type plotters. Lately, liquid ejecting apparatuses are also applied to various production apparatuses, utilizing their advantages of being capable of causing small amounts of liquid to accurately land on predetermined positions. Examples of the applications include display production apparatuses that produce color filters for liquid crystal displays and the like, electrode forming apparatuses that form electrodes for organic electroluminescence (EL) displays, field emission displays (FED), etc., and chip production apparatuses that produce biochips (biochemical devices). A recording head for an image recording apparatus ejects liquid-state inks and a color material ejecting head for a display production apparatus ejects solutions of various color materials of red (R), green (G), blue (B), etc. Furthermore, an electrode material ejecting head for an electrode forming apparatus ejects an electrode material in a liquid state and a bioorganic material ejecting head for a chip production apparatus ejects a solution of a bioorganic material.

In liquid ejecting heads as mentioned above, a piezoelectric layer that is a kind of a dielectric layer sandwiched between a first electrode layer and a second electrode layer is driven by applying voltage (electric signal) to the two electrode layers. This driving causes pressure changes to occur in the liquid in a pressure chamber and the pressure changers are utilized to eject the liquid from the nozzle. That is, the two electrode layers and the portion sandwiched therebetween function as a piezoelectric element that causes pressure changes in the pressure chamber. Some such liquid ejecting heads have a structure in which a third electrode connected to a wiring substrate or the like is stacked on an end portion of the second electrode layer stacked above a piezoelectric layer and in which the piezoelectric layer and the first electrode layer extend more to an outer side (a side opposite to a drive region) than the third electrode layer does (see JP-A-2004-136663).

In constructions as described above there is a possibility that an end portion of a region where an electric field is formed between the two electrodes, that is, a dielectric layer in an end portion of the second electrode layer, may be broken by leakage current flowing in the end portion of the second electrode. Concretely, there is a possibility that burnout of the end portion of the second electrode layer may occur.

SUMMARY

An advantage of some aspects of the invention is that a MEMS device, a liquid ejecting head, and a liquid ejecting apparatus in which the breakage, such as burnout or the like, of an end portion of a second electrode layer stacked on a dielectric layer, is inhibited can be provided.

A MEMS device according to one aspect of the invention includes a drive region having a stacked structural body in which a first electrode layer, a first dielectric layer, and a second electrode layer are stacked in that order. The stacked structural body extends from the drive region to a non-drive region that is outer than the drive region and, in an extending direction of the stacked structural body, the first electrode layer and the first dielectric layer extend farther outward than the second electrode layer. A second dielectric layer covering an end of the second electrode layer in the extending direction is stacked on the second electrode layer in the non-drive region and the first dielectric layer that is formed outer in the extending direction than the second electrode layer. A third electrode layer electrically connected to the second electrode layer is stacked on the second dielectric layer and on the second electrode layer in a region outside the second dielectric layer. In the extending direction, the end of the second electrode layer is formed more to a drive region side than a second dielectric layer-side end of the third electrode layer.

According to this aspect of the invention, the second dielectric layer and the third electrode layer are stacked on the first dielectric layer in the region that is outer than the end of the second electrode layer in the extending direction of the stacked structural body. Therefore, the voltage that acts between the first electrode layer and the third electrode layer in that region can be divided into the first dielectric layer and the second dielectric layer. Because of this, the electric field strength applied to the first dielectric layer in the region can be made less than the electric field strength applied to the dielectric layer sandwiched between the first electrode layer and the second electrode layer. As a result, leakage current flowing in the first dielectric layer can be inhibited and breakage of the first dielectric layer can be inhibited.

In the foregoing MEMS device, in a direction orthogonal to a stacking direction of the stacked structural body and orthogonal to the extending direction, a measurement of an overlap of the third electrode layer with the second dielectric layer may be larger than a measurement of the first electrode layer.

According to this embodiment, the end of the second electrode layer in the extending direction of the stacked structural body is certainly covered by the second dielectric layer and the third electrode layer, so that leakage current flowing in the first dielectric layer can be further inhibited.

A second aspect of the invention provides a liquid ejecting head that includes the above-described MEMS device, a pressure chamber that is at least partially defined by the drive region, and a nozzle that communicates with the pressure chamber. In this liquid ejecting head, the first dielectric layer is a piezoelectric layer, and the second dielectric layer is a resin.

According to this aspect of the invention, the breakage of the piezoelectric layer caused by flow of leakage current can be inhibited, so that the reliability of the liquid ejecting head can be improved.

A third aspect of the invention provides a liquid ejecting apparatus that includes the above-described liquid ejecting head.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention will be described hereinafter with reference to the accompanying drawings. It is to be noted that although the following exemplary embodiments include various limitations as preferred concrete examples of the invention, the scope of the invention is not limited by the following embodiments or examples unless it is mentioned that the invention is thereby particularly limited. Furthermore, the following description cites as an example a liquid ejecting head that is a type of MEMS device and, particularly, an ink jet type recording head (hereinafter, referred to as recording head) 3 that is a kind of liquid ejecting head.

Figure 1:
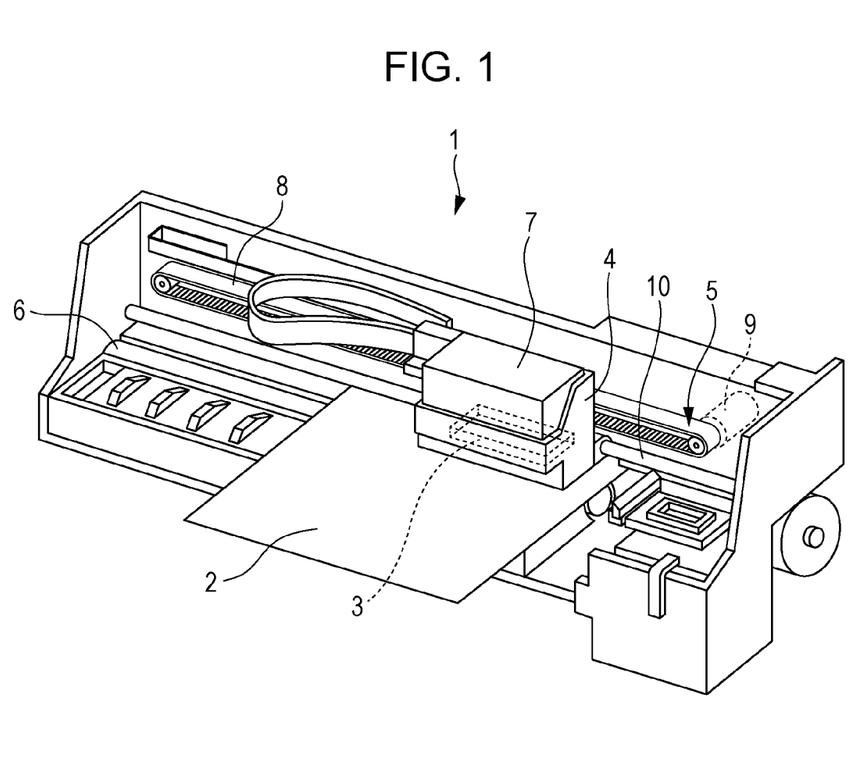
FIG. 1 is a perspective view illustrating a construction of a printer.

A construction of an ink jet type printer (hereinafter, printer) 1 that is a kind of liquid ejecting apparatus in which a recording head 3 is mounted will be described with reference to FIG. 1. The printer 1 is an apparatus that records images and the like by ejecting ink (a kind of liquid) to a surface of a recording medium 2 (a kind of object on which to land a liquid) such as recording sheets or the like. This printer 1 includes a recording head 3, a carriage 4 to which the recording head 3 is attached, a carriage moving mechanism 5 that moves the carriage 4 in a main scanning direction, a transporting mechanism 6 that moves the recording medium 2 in a subsidiary scanning direction, etc. The foregoing ink is stored in an ink cartridge 7 as a liquid supply source. This ink cartridge 7 is detachably fitted to the recording head 3. Note that it is also possible to adopt a construction in which an ink cartridge is disposed on a main body side of a printer and ink is supplied from the ink cartridge to a recording head through an ink supply tube.

The carriage moving mechanism 5 includes a timing belt 8. The timing belt 8 is driven by a pulse motor 9 that is a direct-current (DC) motor or the like. Therefore, when the pulse motor 9 operates, the carriage 4 is guided by a guide rod 10 extending through a space in the printer 1 and supported by the printer 1 and is moved back and forth in the main scanning direction (width direction of the recording medium 2). The position of the carriage 4 in the main scanning direction is detected by a linear encoder (not shown) that is a kind of position information detector. The linear encoder sends a detection signal, that is, encoder pulses (a kind of positional information) to a control unit of the printer 1.

Figure 2:
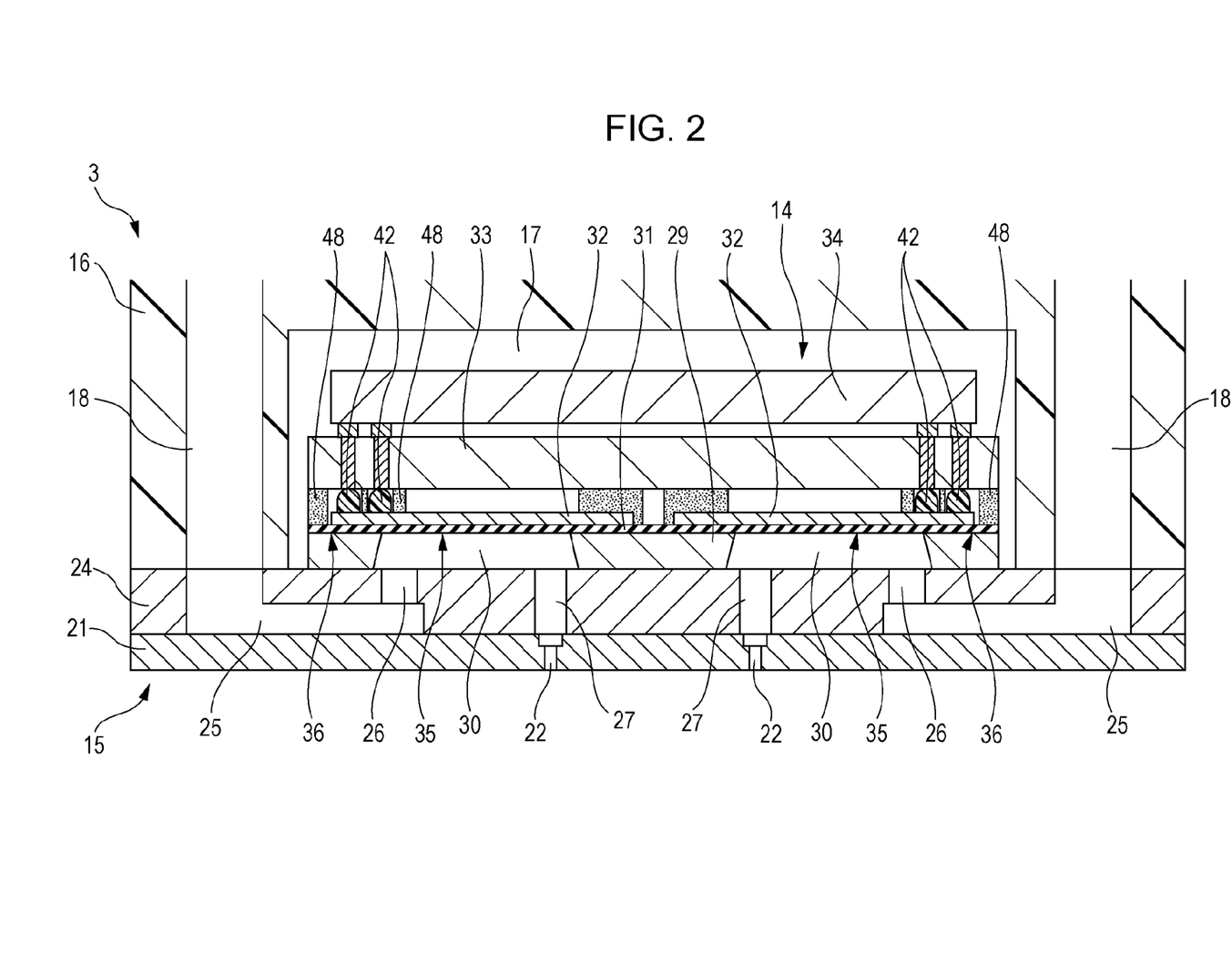
FIG. 2 is a sectional view illustrating a construction of a recording head.
Figure 3:
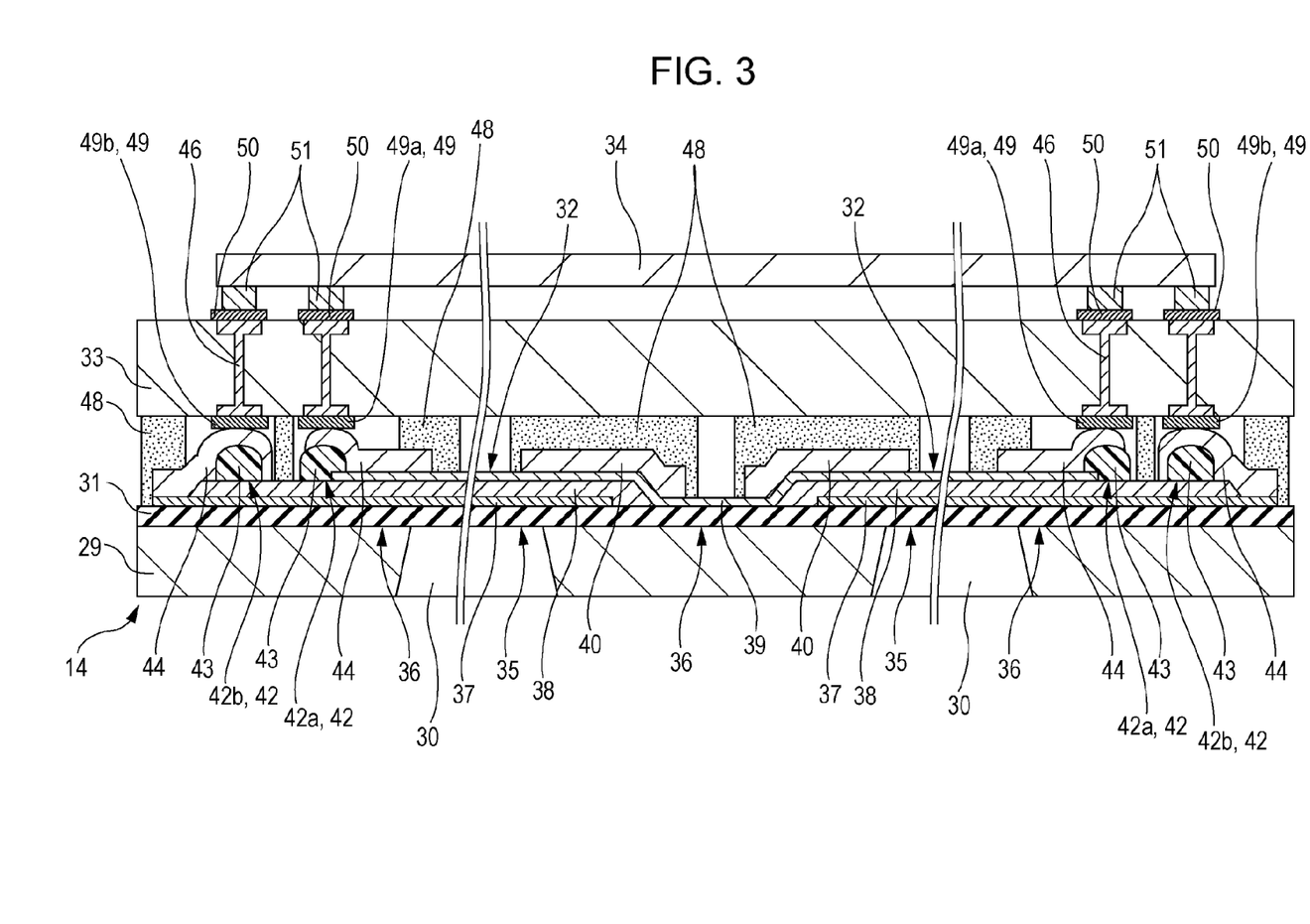
FIG. 3 is a sectional view illustrating a construction of an actuator unit.
Figure 4:
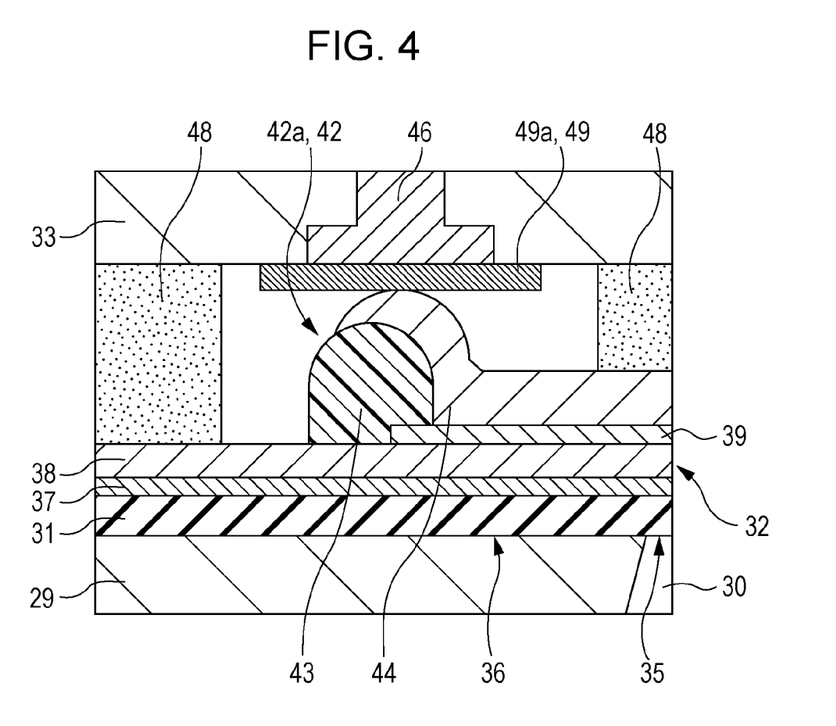
FIG. 4 is an enlarged sectional view of portions of the actuator unit.
Figure 5:
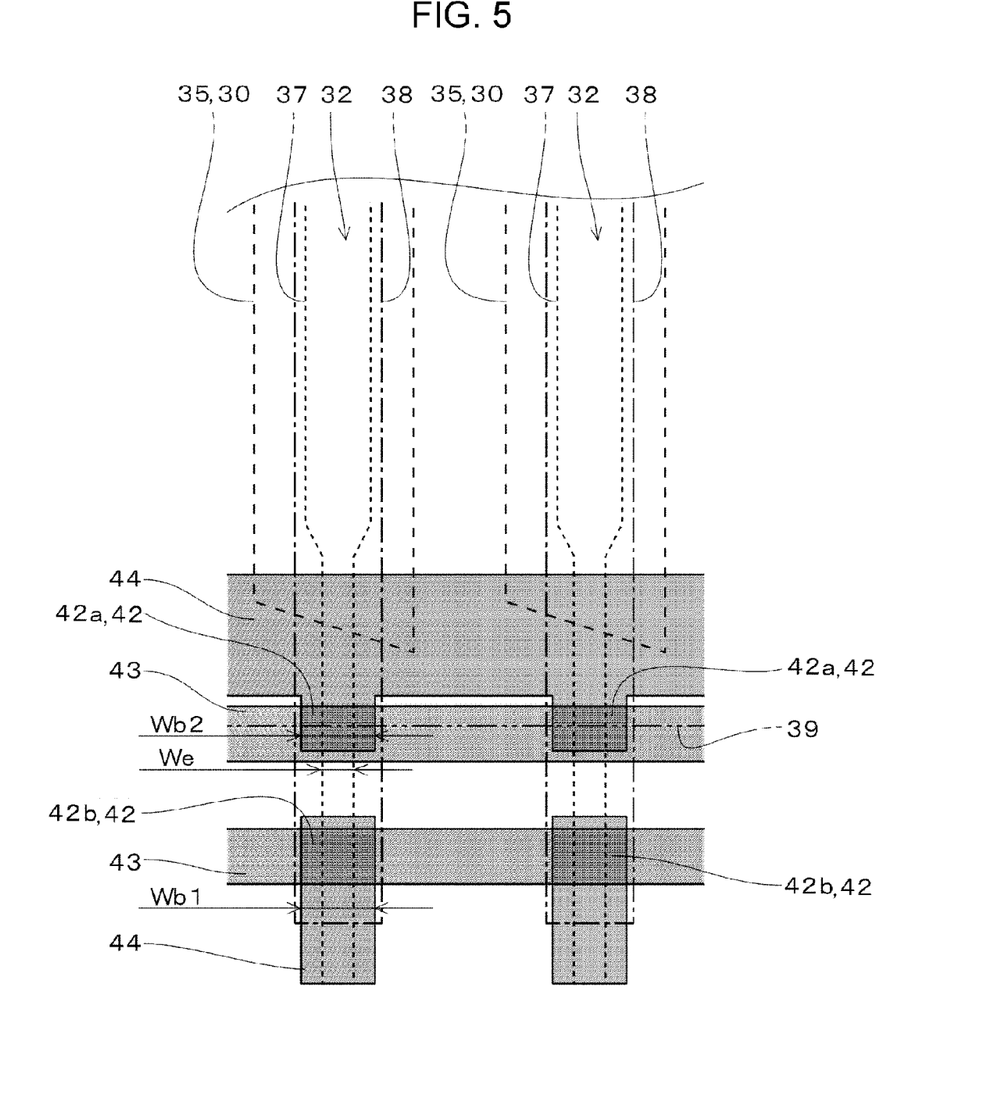
FIG. 5 is a plan view illustrating a construction of the actuator unit.

Next, the recording head 3 will be described. FIG. 2 is a sectional view describing a construction of the recording head 3. FIG. 3 is an enlarged sectional view of portions of the recording head 3 and, more specifically, a sectional view of an actuator unit 14. FIG. 4 is an enlarged sectional view of portions of the actuator unit 14 (i.e., an end portion of a left piezoelectric element 32 in FIG. 3). FIG. 5 is an enlarged plan view of portions of the actuator unit 14. Note that, for the sake of convenience in description, the stacking direction of various members that constitute the actuator unit 14 is defined as up-down directions. The recording head 3 in this exemplary embodiment, in which the actuator unit 14 and a flow passageway unit 15 are stacked, is attached to a head case 16 as shown in FIG. 2.

The head case 16 is a box-shaped member made of a synthetic resin. Inside the head case 16 there is formed a liquid introduction passageway 18 that supplies ink to pressure chambers 30. This liquid introduction passageway 18 is a space that stores ink common to a plurality of pressure chambers 30 together with common liquid chambers 25 described below. In this exemplary embodiment, the pressure chambers 30 are provided side by side in two rows and, corresponding to the two rows of the pressure chambers 30, two liquid introduction passageways 18 are formed. In a lower surface-side portion of the head case 16 there is formed a housing space 17 extending from a lower surface of the head case 16 to an intermediate level in the height direction of the head case 16. The housing space 17 has a hollow or dented rectangular parallelepiped shape. When the flow passageway unit 15 described below is positioned on and joined to the lower surface of the head case 16, the actuator unit 14 and a wiring substrate 33 stacked on a communication substrate 24 are housed within the housing space 17.

The flow passageway unit 15 joined to the lower surface of the head case 16 includes a nozzle plate 21 having the openings of a plurality of nozzles 22 that are aligned in rows and the communication substrate 24 provided with common liquid chambers 25 and the like. The plurality of nozzles 22 disposed in the form of a row (nozzle row), which include a one end-side nozzle 22 and an other (opposite) end-side nozzle 22, are equidistantly disposed at a pitch that corresponds to the dot formation density. Each of the common liquid chambers 25 is a flow passageway common to a plurality of pressure chambers 30 and has an elongated shape along the side-by-side alignment direction of the pressure chambers 30 (along the nozzle row direction). Each common liquid chamber 25 and corresponding ones of the pressure chambers 30 communicate with each other via individual communication paths 26 that are formed in the communication substrate 24. Thus, the ink within the common liquid chambers 25 is distributed to the pressure chambers 30 via the individual communication paths 26. Each nozzle 22 and a corresponding one of the pressure chambers 30 communicate with each other via a nozzle communication passageway 27 that penetrates the communication substrate 24 in a plate thickness direction.

The actuator unit 14, as shown in FIGS. 2 and 3, include a pressure chamber forming substrate 29, a vibration plate 31, a piezoelectric element 32, a wiring substrate 33, and a drive integrated circuit (IC) 34 have been stacked and unitized. Thus, the actuator unit 14 in the unitized state is housed within the housing space 17.

The pressure chamber forming substrate 29 is a hard plate member made of silicon and has been manufactured from a silicon single crystal substrate whose surfaces (upper and lower surfaces) are (110) surfaces. In this pressure chamber forming substrate 29, a plurality of spaces that are to be pressure chambers 30 have been formed along the nozzle row direction by removing portions in the plate thickness direction by etching. These spaces are defined at their lower side by the communication substrate 24 and at their upper side by the vibration plate 31 so as to form the pressure chambers 30. Furthermore, these spaces, that is, the pressure chambers 30, have been formed in two rows corresponding to the two nozzle rows. Each pressure chamber 30 has a shape elongated in a direction orthogonal to the nozzle row direction and communicates at a one-side end portion thereof in the lengthwise direction with a individual communication path 26 and communicates at an other-side (opposite-side) end portion with a nozzle communication passageway 27. Incidentally, the side walls of each pressure chamber 30 in this exemplary embodiment are oblique to the upper surface (or the lower surface) of the pressure chamber forming substrate 29, because of the crystallinity of the silicon single crystal substrate.

The vibration plate 31 is a thin film-shaped member having elasticity and has been stacked on the upper surface of the pressure chamber forming substrate 29 (the surface opposite to the communication substrate 24). This vibration plate 31 seals upper openings of the spaces that are to be the pressure chambers 30. That is, the vibration plate 31 defines the upper surface of the pressure chamber 30, that is, a portion of the pressure chamber 30. Portions of the vibration plate 31 that define the upper surfaces of the pressure chambers 30 function as displacement portions that deform (are displaced) in a direction away from the nozzles 22 or a direction toward the nozzles as the piezoelectric elements 32 undergo bending deformation. That is, portions of the vibration plate 31 which define a portion of each pressure chamber 30, concretely, the upper surface of each pressure chamber 30, are drive regions 35 in which bending deformation is permitted. On the other hand, portions of the vibration plate 31 that are outside the upper openings of the pressure chambers 30 (portions outside the drive regions 35) are non-drive regions 36 in which bending deformation is inhibited. Incidentally, the vibration plate 31 is made up of, for example, an elastic film formed on an upper surface of the pressure chamber forming substrate 29 from silicon dioxide ($SiO_2$) and a dielectric film formed on the elastic film from zirconium dioxide ($ZrO_2$). Then, the piezoelectric elements 32 are stacked at locations on this insulating film (on the opposite surface of the vibration plate 31 to the pressure chamber 30 side) which correspond to the drive regions 35.

The piezoelectric elements 32 in this exemplary embodiment are so-called bend-mode piezoelectric elements. The piezoelectric elements 32 are provided side by side in two rows corresponding to the two rows of the pressure chambers 30. Each piezoelectric element 32, as shown in FIG. 3, has been formed by sequentially stacking on the vibration plate 31 a lower electrode layer 37 (that corresponds to a first electrode layer in the invention), a piezoelectric layer 38 (that corresponds to a first dielectric layer in the invention) that is a kind of dielectric (insulator), and an upper electrode layer 39 (that corresponds to a second electrode layer in the invention). That is, each piezoelectric element 32 is a kind of stacked structural body made up of the lower electrode layer 37, the piezoelectric layer 38, and the upper electrode layer 39. In this exemplary embodiment, the lower electrode layers 37 are electrodes independently formed separately for each piezoelectric element 32 whereas the upper electrode layer 39 is a common electrode formed continuously over the plurality of piezoelectric elements 32. That is, as shown in FIG. 5, the lower electrode layers 37 and the piezoelectric layers 38 are formed separately for each pressure chamber 30. On the other hand, the upper electrode layer 39 is formed over the plurality of pressure chambers 30. Furthermore, in this exemplary embodiment, as shown in FIG. 3, the pressure chambers 30 are provided side by side in two rows, so that, correspondingly, the lower electrode layers 37 and the piezoelectric layers 38 are provided side by side in two rows. The upper electrode layer 39 is formed over a location that corresponds to one of the two rows of pressure chambers 30 (e.g., the left one in FIG. 3) and a location that corresponds to the other row of pressure chambers 30 (e.g., the right one in FIG. 3). The shapes of the layers 37, 38 and 39 that constitute the piezoelectric elements 32 will be described later in detail.

Furthermore, as shown in FIGS. 2 and 3, resin core bumps 42 connected to piezoelectric element-side terminals 49 of the wiring substrate 33 are formed on one-side end portions of the piezoelectric elements 32 of the one-side row which are at one side end in the extending direction of each piezoelectric element 32 or on one-side end portions of the piezoelectric layers 38 in the same extending direction which are protruded out of the one-side end portions of piezoelectric elements 32. In this exemplary embodiment, each of the resin core bumps 42 for the piezoelectric elements 32 includes a common bump 42a electrically connected to the upper electrode layer 39 and bumps 42b electrically connected to the lower electrode layers 37. Each resin core bump 42 is formed by stacking a resin portion 43 (that corresponds to a second dielectric layer in the invention) made of a synthetic resin that is a kind of dielectric and an electroconductive layer 44 (that corresponds to a third electrode layer in the invention) made of a metal. The shapes of the layers 43 and 44 that constitute the resin core bumps 42 will be described in detail later. On a portion of the upper electrode layer 39 at the other-side end of the piezoelectric elements 32 of the one-side row in the extending direction of each piezoelectric element 32 there is formed a metal weight layer 40 made of the same metal as the electroconductive layer 44. This metal weight layer 40 extends, in the lengthwise direction (extending direction) of each piezoelectric element 32, from a region that overlaps with other-side end portions of the drive regions 35 to a region that overlaps with portions of the non-drive regions 36 that are protruded out of the other-side ends of the piezoelectric layers 38.

The wiring substrate 33, as shown in FIG. 3, is a flat platy substrate connected to the pressure chamber forming substrate 29 (more specifically, the pressure chamber forming substrate 29 on which the vibration plate 31 is stacked), with the resin core bumps 42 interposed therebetween. Between the wiring substrate 33 and the vibration plate 31 there is formed a space that has such a size as not to inhibit deformation of the piezoelectric elements 32. In this exemplary embodiment, the wiring substrate 33 and the pressure chamber forming substrate 29 are joined by an adhesive 48 that has both heat curability and photosensitivity. The upper surface (drive IC 34-side surface) of the wiring substrate 33 is provided with drive IC-side terminals 50 to which bumps 51 of the drive IC 34 are connected. Furthermore, a lower surface (vibration plate 31-side surface) of the wiring substrate 33 is provided with piezoelectric element-side terminals 49 to which the resin core bumps 42 are connected. The piezoelectric element-side terminals 49 include piezoelectric element-side common terminals 49a formed at locations facing the common bumps 42a and connected to the common bump 42a and piezoelectric element-side terminals 49b formed at locations facing the bumps 42b and connected to the bumps 42b. Each piezoelectric element-side terminal 49 becomes electrically connected to the electroconductive layer 44 of a corresponding one of the resin core bumps 42 as that resin core bump 42 is pressed against the piezoelectric element-side terminal 49 and thus elastically deformed. Furthermore, the wiring substrate 33 is provided with penetrating wirings 46 that penetrate the wiring substrate 33 in the plate thickness direction and that interconnect the piezoelectric element-side terminals 49 (or lower surface-side wirings connected to the piezoelectric element-side terminals 49) and corresponding drive IC-side terminals 50 (or upper surface-side wirings connected to the drive IC-side terminals 50).

The drive IC 34 is an IC chip that outputs a signal for driving the piezoelectric elements 32 and is stacked on the upper surface of the wiring substrate 33 via an adhesive (not graphically shown) such as an anisotropic electroconductive film (ACF) or the like. As shown in FIG. 3, a wiring substrate 33-side surface of the drive IC 34 is provided with the bumps 51 connected to the drive IC-side terminals 50. The bumps 51 are protruded from a lower surface of the drive IC 34 to the wiring substrate 33 side.

In the recording head 3 constructed as described above, ink from the ink cartridge 7 is introduced to the pressure chambers 30 via the liquid introduction passageway 18, the common liquid chambers 25, the individual communication paths 26, etc. While this state is maintained, the drive signal from the drive IC 34 is supplied to the piezoelectric elements 32 via the wiring formed in the wiring substrate 33, etc., so that the piezoelectric elements 32 are driven to cause pressure changes in the pressure chambers 30. By utilizing the pressure changes, the recording head 3 ejects ink drops from the nozzles 22 through the nozzle communication passageways 27.

Next, the layers 37, 38 and 39 that constitute each piezoelectric element 32 will be described in detail. As shown in FIG. 5, the lower electrode layer 37 of each piezoelectric element 32 in this exemplary embodiment has a width (measurement in the nozzle row direction) smaller than the width of the drive region 35 (the pressure chamber 30) and extends along the lengthwise direction of the pressure chamber 30 (direction orthogonal to the nozzle row direction). In each piezoelectric element 30 in this exemplary embodiment, the width of the lower electrode layer 37 extending from an end portion of the drive region 35 to the non-drive region 36 is narrower (smaller) than the width of the lower electrode layer 37 formed in a central portion of the drive region 35. In other words, the width of an end portion of the lower electrode layer 37 is smaller than the width of a central portion of the electrode layer 37. Incidentally, the width of the end portion of the lower electrode layer 37 is narrower than the width of the resin core bumps 42 (more specifically, the width of the electroconductive layers 44 of the resin core bumps 42). Furthermore, as shown in FIG. 3, the two ends of the lower electrode layer 37 in the extending direction (lengthwise direction) extend from the drive region 35 to the non-drive regions 36. Concretely, in this exemplary embodiment, the one-side end of the lower electrode layer 37 (located at an outer side in the actuator unit 14) extends farther outward than the one-side end of the piezoelectric layer 38. The electroconductive layer 44 of a bump 42b is stacked on the portion of the lower electrode layer 37 which is outer than the one-side end of the piezoelectric layer 38. The other-side end of the lower electrode layer 37 in the extending direction (located at an inner side in the actuator unit 14) extends to the non-drive region 36 between the other-side end of the drive region 35 and the other-side end of the piezoelectric layer 38.

Furthermore, the piezoelectric layer 38 of each piezoelectric element 32 in the exemplary embodiment, as shown in FIG. 5, has a width smaller than the width of the drive region 35 and extends along the lengthwise direction of the pressure chamber 30. The two ends of the piezoelectric layer 38 in the extending direction (lengthwise direction) extend from the drive region 35 to the non-drive regions 36 as shown in FIG. 3. Concretely, in the exemplary embodiment, the one-side end of the piezoelectric layer 38 of each piezoelectric element 32 extends to a portion of the non-drive region 36 which is located between the one-side end of the drive region 35 (more specifically, the one-side end of the upper electrode layer 39) and the one-side end of the lower electrode layer 37. That is, in the lengthwise direction of each piezoelectric element 32, the lower electrode layer 37 and the piezoelectric layer 38 extend farther outward than the upper electrode layer 39. On an end portion of the piezoelectric layer 38 which is in the outer non-drive region 36 and outer than the upper electrode layer 39, the bumps 42b are stacked. Furthermore, the other-side end of the piezoelectric layer 38 in the extending direction extends farther outward than the other-side end of the lower electrode layer 37.

Furthermore, in the nozzle row direction, the two ends of the upper electrode layer 39 in the exemplary embodiment, as indicated in FIG. 5, extend farther outward than a region that extend over or overlap with a group of the two rows of the pressure chambers 30. Furthermore, as shown in FIG. 3, the upper electrode layer 39 is formed from the non-drive region 36 at one end side in the actuator unit 14 to the non-drive region 36 at the other end side in the actuator unit 14 in the lengthwise direction of each pressure chamber 30. Concretely, a one-side end of the upper electrode layer 39 in the extending direction extends to a region that overlaps with the one-side one of the two rows of the side-by-side aligned piezoelectric layers 38 (e.g., the left row in FIG. 3) and that is in the non-drive regions 36 on the outer side of the one-side ones of the drive regions 35. More specifically, the one-side end of the upper electrode layer 39 in the extending direction extends to a region between the outer side end of the one-side drive regions 35 and the outer side end of one-side piezoelectric layers 38. Furthermore, the other-side end of the upper electrode layer 39 in the extending direction extends to a region that overlaps with the other-side one of the two rows of the piezoelectric layers 38 (e.g., the right row in FIG. 3) and that is in the non-drive regions 36 on the outer side of the other-side ones of the drive regions 35. More specifically, the other-side end of the upper electrode layer 39 in the extending direction extends to a region between the outer side end of the other-side ones of the drive regions 35 and the outer side end of the other-side ones of the piezoelectric layers 38.

A region in which all of a lower electrode layer 37, a piezoelectric layer 38, and the upper electrode layer 39 are stacked, that is, a region in which a piezoelectric layer 38 is sandwiched between a lower electrode layer 37 and the upper electrode layer 39, functions as a piezoelectric element 32. That is, when an electric field is created between the lower electrode layer 37 and the upper electrode layer 39 according to the potential difference between the two electrodes, the piezoelectric layer 38 in the drive region 35 undergoes bending deformation in a direction away from the nozzle 22 or a direction toward the nozzle 22, thus bending the vibration plate 31 in the drive region 35. However, an overlap of the piezoelectric element 32 with the non-drive region 36 is inhibited from deforming (being displaced), because of the pressure chamber forming substrate 29. On the one-side end of each piezoelectric element 32 in the exemplary embodiment in the lengthwise direction, the common bump 42a is stacked so as to be astride (to cover) the one-side end of the piezoelectric elements 32. The electroconductive layer 44 of this common bump 42a is electrically connected to the upper electrode layer 39 and extends farther outward than the upper electrode layer 39, so that an electric field is applied to an outer portion of the piezoelectric layer 38 which extends beyond the outer end of the upper electrode layer 39. This will be described in detail later.

The lower electrode layers 37 and the upper electrode layer 39 described above can be made of various metals, such as iridium (Ir), platinum (Pt), titanium (Ti), tungsten (W), nickel (Ni), palladium (Pd), and gold (Au), alloys of these metals, alloys such as $LaNiO_3$, etc. The piezoelectric layers 38 can be made of ferroelectric piezoelectric materials such as lead zirconate titanate (PZT), and relaxor ferroelectrics made by adding to such ferroelectric piezoelectric materials a metal such as niobium (Nb), nickel (Ni), magnesium (Mg), bismuth (Bi), or yttrium (Y). Furthermore, non-lead materials, such as barium titanate, can also be used for the piezoelectric layers 38.

Next, the resin core bumps 42 protruded from the piezoelectric element 32 and from the piezoelectric layer 38 to the wiring substrate 33 side will be described. In this exemplary embodiment, as shown in FIG. 3, the resin core bumps 42 are the common bump 42a formed on the end portions of the piezoelectric elements 32 in their extending direction and connected to the piezoelectric element-side common terminal 49a and the bumps 42b which are formed on outer portions of the piezoelectric layers 38 that are outer than the common bump 42a and which are connected to the piezoelectric element-side terminals 49b. The surface of each resin core bump 42 is curved in an arc or convex shape toward the wiring substrate 33 side in a view of a cross-section along the lengthwise direction of pressure chambers 30. The resin portions 43 of the resin core bumps 42 are made of, for example, an elastic synthetic resin (also referred to simply as resin) made up of a polyimide resin, a phenol resin, an epoxy resin, etc. The electroconductive layers 44 are made of gold (Au), copper (Cu), alloys of these metals, etc. In the case where the electroconductive layers 44 are made of gold (Au) or the like, an adhesion layer made of any of titanium (Ti), nickel (Ni), chrome (Cr), tungsten (W), alloys of these metals, etc. may be provided below the electroconductive layers 44.

The resin portion 43 of each of the bumps 42b in this exemplary embodiment, as shown in FIG. 3, is stacked on an outer portion of the piezoelectric layer 38 that is outer than the one-side end of the upper electrode layer 39 in the extending direction of the lower electrode layer 37 (the lengthwise direction of the pressure chamber 30). Furthermore, as shown in FIG. 5, the resin portion 43 of the bumps 42b extends farther outward in the nozzle row direction than the group of the two rows of piezoelectric elements 32 provided side by side in the nozzle row direction. That is, the resin portion 43 of the bumps 42b is formed over the plurality of lower electrode layers 37 protruded from the piezoelectric elements 32. The electroconductive layers 44 of the bumps 42b stacked on the surface of the resin portion 43, as shown in FIG. 5, are formed corresponding one-to-one to the lower electrode layers 37, which are electrodes of the piezoelectric elements 32. In other words, the bumps 42b are formed individually for each of the piezoelectric elements 32. Furthermore, in this exemplary embodiment, the width (measurement in the nozzle row direction) Wb1 of the electroconductive layer 44 of the bumps 42b is wider (larger) than the width We of each lower electrode layer 37 measured at a location at which the lower electrode layer 37 overlaps with the electroconductive layer 44. That is, the width Wb1 of the bumps 42b is wider (larger) than the width We of the lower electrode layers 37 in the non-drive region 36. Furthermore, in this exemplary embodiment, as shown in FIGS. 3 and 5, the electroconductive layer 44 of each of the bumps 42b extends, in the extending direction of the lower electrode layers 37, from a location at which the electroconductive layer 44 overlaps with the resin portion 43 of the bumps 42b to a location at which the electroconductive layer 44 overlaps with an outer portion of the lower electrode layer 37 which is formed outer than the one-side end of the piezoelectric layer 38. Therefore, the electroconductive layer 44 of each of the bumps 42b is electrically connected to a corresponding one of the lower electrode layers 37.

In this exemplary embodiment, the resin portion 43 of the common bumps 42a, as shown in FIGS. 3 and 4, is stacked astride the one-side end of the upper electrode layer 39 in the non-drive region 36 in the extending direction of the lower electrode layer 37, that is, on both a one-side end portion of the upper electrode layer 39 and an outer portion of the piezoelectric layer 38 that is formed outer than the one-side end portion of the upper electrode layer 39. That is, in the extending direction of the lower electrode layers 37, the resin portion 43 of the common bumps 42a extends from the one-side end portions of the upper electrode layers 39 onto the piezoelectric layers 38 and covers the one-side end of the upper electrode layer 39. Furthermore, as shown in FIG. 5, the resin portion 43 of the common bumps 42a, similar to the resin portion 43 of the bumps 42b, extends farther outward in the nozzle row direction than the group of the two rows of piezoelectric elements 32 provided side by side in the nozzle row direction. As shown in FIGS. 3 to 5, at locations that correspond to the piezoelectric elements 32, the electroconductive layer 44 stacked on the surface of the resin portion 43 of the common bumps 42a extends along the extending direction of the lower electrode layers 37 from a location at which the electroconductive layer 44 overlaps with the resin portion 43 of the common bump 42a to a location at which the electroconductive layer 44 overlaps with a portion of the upper electrode layer 39 which is in a region outside the resin portion 43. Thus, the electroconductive layer 44 of the common bumps 42a is electrically connected to the upper electrode layer 39. More specifically, in the extending direction of the lower electrode layers 37, the electroconductive layer 44 of the common bumps 42a formed at locations that correspond to the piezoelectric elements 32 extends from a region between a one-side end of the resin portion 43 of the common bumps 42a and the one-side end of the upper electrode layer 39 to a region in which the electroconductive layer 44 overlaps with a one-side end portion of the upper electrode layer 39 in the drive regions 35. Specifically, in the extending direction of the lower electrode layers 37, the one-side end of the upper electrode layer 39 is formed more to the other side (the drive region 35 side) than the one-side end of the electroconductive layer 44 of the common bumps 42a (the resin portion 43-side end of the common bumps 42a).

Thus, in the extending direction of the lower electrode layers 37, the resin portion 43 of the common bumps 42a covers a one-side end of the upper electrode layer 39, the electroconductive layer 44 of the common bumps 42a which is electrically connected to the upper electrode layer 39 is stacked on the resin portion 43 of the common bumps 42a at locations that correspond to the piezoelectric elements 32, and the one-side end of the upper electrode layer 39 is formed more to the other side than the one-side end of the electroconductive layer 44 of the common bumps 42a. Therefore, the breakage of the piezoelectric layers 38, the upper electrode layer 39, etc. resulting from leakage current flowing in the one-side end of the upper electrode layer 39 can be inhibited. Specifically, leakage current flowing from the end of the upper electrode layer 39 can be inhibited because the end of an electrode stacked above the piezoelectric layers 38 and of a region in which that electrode and the lower electrode layers 37 create an electric field across the piezoelectric layers 38 is not the end of the upper electrode layer 39 but the end of the electroconductive layer 44 of the common bumps 42a. Furthermore, in a region which is outer than the end of the upper electrode layer 39 and in which the electrode layer 44 of the common bumps 42a is formed, the resin portion 43, which is a dielectric, is formed between the electroconductive layer 44 and the piezoelectric layers 38. Therefore, the voltage that acts between the electroconductive layer 44 and the lower electrode layers 37 in that region can be divided into the resin layer 43 and the piezoelectric layers 38. Because of this, the electric field strength applied to the piezoelectric layers 38 in the region can be made less than the electric field strength applied to the piezoelectric layers 38 sandwiched between the upper electrode layer 39 and the lower electrode layers 37. As a result, the withstanding voltage of the end portion of the electroconductive layer 44 of the common bumps 42a can be increased so that leakage current flowing in the piezoelectric layers 38 can be inhibited. Therefore, breakage or the like of the piezoelectric layers 38 in end portions of the piezoelectric elements 32 can be inhibited, so that the reliability of the recording head 3 and therefore the reliability of the printer 1 can be improved.

Concretely, where the voltage that acts between the lower electrode layers 37 and the upper electrode layer 39 (the electroconductive layer 44 of the common bumps 42a which is electrically connected to the upper electrode layer 39) (i.e., the potential difference between the lower electrode layers 37 and the upper electrode layer 39) is V, the capacitance per unit area of the piezoelectric layers 38 is C1, and the capacitance per unit of the resin portion 43 is C2, the voltage V1 that acts in the stacking direction of the piezoelectric layers 38 in a region which is outer than the end of the upper electrode layer 39 and in which the electroconductive layer 44 of the common bumps 42a is formed is expressed by the following formula.

$$V1=(C2\times V)/(C1+C2)$$

As can be understood from this formula, the smaller the capacitance C2 per unit area of the resin portion 43, the smaller the voltage V1 that acts in the stacking direction of the piezoelectric layers 38. That is, by reducing the capacitance C2 per unit area of the resin portion 43, the withstanding voltage of an end portion of each piezoelectric element 32 (a region in which the piezoelectric layer 38 and the resin portion 43 are sandwiched between the lower electrode layer 37 and the electroconductive layer 44) can be increased. Therefore, it is desirable to adopt a construction that makes the capacitance per unit area of the resin portion 43 as small as possible.

For example, in order to increase the withstanding voltage of the end portion of each piezoelectric element 32 to at least twice the withstanding voltage in the related-art construction of piezoelectric elements, that is, the withstanding voltage of a region in which the piezoelectric layer 38 is sandwiched between the lower electrode layer 37 and the upper electrode layer 39, it suffices that the following formula is satisfied, where d1 is the film thickness of the piezoelectric layer 38, $\epsilon 1$ is the relative dielectric constant of the piezoelectric layer 38, d2 is the film thickness of the resin portion 43, and $\epsilon 2$ is the relative dielectric constant of the resin portion 43.

$$d2/d1 \geq \epsilon 2/\epsilon 1$$

For example, when the film thickness d1 of the piezoelectric layer 38 is 1000 nm, the relative dielectric constant $\epsilon 1$ of the piezoelectric layer 38 is 1600, and the relative dielectric constant $\epsilon 2$ of the resin portion 43 is 4, the withstanding voltage of the end portion of the piezoelectric element 32 is at least twice the withstanding voltage in the related-art construction provided that the film thickness d2 of the resin portion 43 is about 2.5 nm or larger.

The breakage caused by leakage current as mentioned above is not limited to the recording head 3 that has piezoelectric elements 32 in the drive regions 35. Substantially the same breakage can also happen in other MEMS devices that have two electrode layers and a dielectric layers (insulator layer) sandwiched between the two electrode layers. That is, there is possibility that a dielectric layer that is not driven may also be broken by leakage current flowing from an end portion of an electrode layer stacked on the dielectric layer. Therefore, as for MEMS devices different from the recording head 3, it is desirable to adopt a construction similar to the construction of the foregoing exemplary embodiment, that is, a construction in which, in the extending direction of the electrode layers, a resin portion covers a one-side end of an electrode layer stacked on a dielectric layer, an electroconductive layer electrically connected to that electrode layer is stacked on the resin portion at a location that corresponds to the dielectric layer, and the end of the electrode layer is formed more to a drive region side than an end of the electroconductive layer.

Note that each of the electroconductive layers 44 of the common bumps 42a in the exemplary embodiment, as shown in FIG. 5, is formed separately for each piezoelectric element 32 in regions in which the electroconductive layer 44 constitutes common bumps 42a, that is, regions in which the electroconductive layer 44 overlaps with the resin portions 43 of common bumps 42a. In other words, the common bumps 42a are formed separately for each of the piezoelectric elements 32. On the other hand, a portion of each electroconductive layer 44 extending, outside the common bumps 42a, on the upper electrode layer 39 extends in the nozzle row direction, forming a continuous electroconductive layer 44. That is, the electroconductive layers 44 stacked on the upper electrode layer 39 are formed over a plurality of piezoelectric elements 32, similar to the upper electrode layer 39. In short, each electroconductive layer 44 is formed on the upper electrode layer 39 and extends over a plurality of piezoelectric elements 32 and, of each electroconductive layer 44, portions that correspond to the piezoelectric elements 32 extend to the resin portion 43 side so as to form common bumps 42a. As shown in FIG. 5, the portions of each electroconductive layer 44 which constitute the common bumps 42a, that is, the common bumps 42a, have a width Wb2 that is wider than the width We of the lower electrode layers 37 measured at locations where the lower electrode layers 37 overlap with the common bumps 42a. In other words, in a direction orthogonal to the stacking direction of the piezoelectric elements 32 and orthogonal to the extending direction of the piezoelectric elements 32, the measurement Wb2 of overlaps of the electroconductive layers 44 with the resin portion 43 of the common bumps 42a is larger than the measurement We of the lower electrode layers 37. Because of this, a one-side end of the upper electrode layer 39 at locations that correspond to the piezoelectric elements 32, that is, one-side ends of the piezoelectric elements 32, can be certainly covered with the resin portions 43 and the electroconductive layer 44. As a result, leakage current flowing in a piezoelectric layer 38 can be further inhibited and breakage of a piezoelectric layer 38 can be further inhibited. In this exemplary embodiment, the width Wb1 of the electroconductive layers 44 of the bumps 42b and the width Wb2 of the common bumps 42a are substantially equal widths and are both wider than the width We of the lower electrode layers 37 measured in the non-drive regions 36.

Although in the foregoing first exemplary embodiment, the common bumps 42a (more specifically, the overlaps of the electroconductive layer 44 with the resin portion 43) are formed separately for each piezoelectric element 32, this construction is not restrictive. A common bump 42a may be formed over a plurality of piezoelectric elements 32. For example, in a second exemplary embodiment shown in FIG. 6, a portion of an electroconductive layer 44 stacked on the resin portion 43 of a common bump 42a is formed over a plurality of piezoelectric elements 32, similarly to a portion of the electroconductive layer 44 stacked on an upper electrode layer 39. Concretely, the resin portion 43 of the common bump 42a, the portion of the electroconductive layer 44 stacked on the resin portion 43, and the portion of the electroconductive layer 44 stacked, outside the resin portion 43, on the upper electrode layer 39 extend, in terms of the nozzle row direction (the side-by-side alignment direction of the piezoelectric elements 32), so that the two ends of the electroconductive layer 44 in the nozzle row direction are outer than an overlap region of the electroconductive layer 44 with the row of the piezoelectric elements 32. That is, the two ends of the common bump 42a in the nozzle row direction are outer than an overlap of the common bump 42a with the row of piezoelectric elements 32. Therefore, the width of the common bump 42a (the measurement thereof in the nozzle row direction) is naturally wider than the width of the lower electrode layers 37. Note that a piezoelectric element-side common terminal of a wiring substrate to which the common bump 42a is connected extends in the nozzle row direction in accordance with the common bump 42a. Therefore, a connecting site between the common bump 42a and the piezoelectric element-side common terminal is also formed over the plurality of piezoelectric elements 32.

Figure 6:
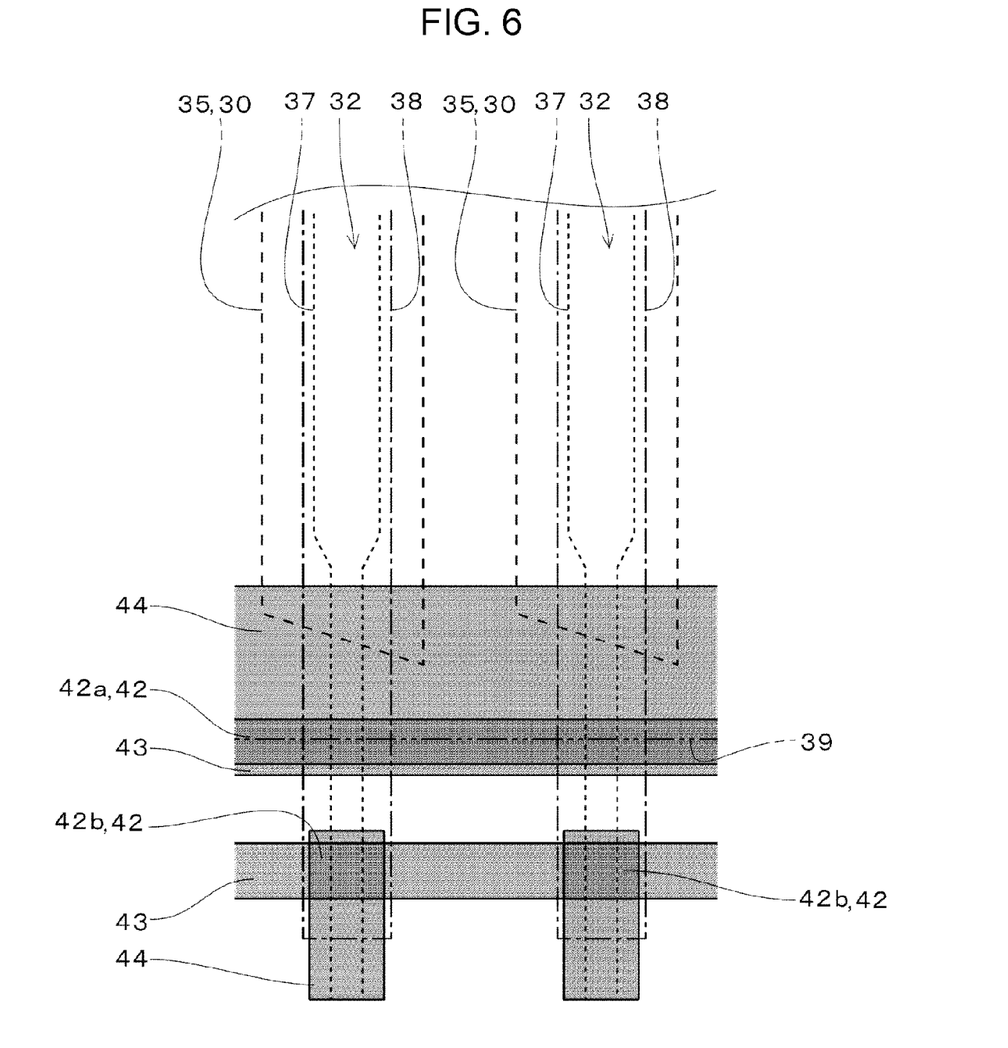
FIG. 6 is a plan view illustrating a construction of an actuator unit according to a second exemplary embodiment of the invention.

Furthermore, in this exemplary embodiment, too, in the extending direction (lengthwise direction) of the lower electrode layers 37, the electroconductive layer 44 of the common bump 42a extends from a region between a one-side end of the resin portion 43 of the common bump 42a and a one-side end of the upper electrode layer 39 to a region in which the electroconductive layer 44 overlaps with a one-side end portion of the upper electrode layer 39 in the drive region 35. Furthermore, in this exemplary embodiment, too, in the extending direction of the lower electrode layers 37, the resin portion 43 of the common bump 42a is formed over a one-side end portion of the upper electrode layer 39 and adjacent portions of the piezoelectric layers 38 and covers the one-side end of the upper electrode layer 39. Specifically, in the extending direction of the lower electrode layers 37, the resin portion 43 of the common bump 42a covers the one-side end of the upper electrode layer 39, the electroconductive layer 44 of the common bump 42a electrically connected to the upper electrode layer 39 is stacked on the resin portion 43 of the common bump 42a at locations that correspond to the piezoelectric elements 32, and the one-side end of the upper electrode layer 39 is formed more to the other side than the one-side end of the electroconductive layer 44 of the common bump 42a. This can inhibit the breakage of the piezoelectric layers 38, the upper electrode layer 39, etc. caused by flow of leakage current. Incidentally, other constructions are substantially the same as in the first exemplary embodiment and will not be described.

Although in the foregoing exemplary embodiments, one row of the upper electrode layer 39 (or upper electrode layers 39) common to the two rows of pressure chambers 30 is formed, this construction is not restrictive. It is possible to adopt a construction in which, corresponding to the two rows of pressure chambers, upper electrode layers are individually formed in regions that correspond one-to-one to the two rows of pressure chambers. Furthermore, although in the foregoing exemplary embodiments, the pressure chambers 30, the piezoelectric elements 32, etc. are formed in two rows, this construction is not restrictive. The pressure chambers, the piezoelectric elements, etc., may also be formed in one row. In these construction, a construction in which, not only at the one-side end of the upper electrode layer but also at the other-side end of the upper electrode layer, the other-side end of the upper electrode layer is covered by a common bump can be adopted. Specifically, it is possible to adopt a construction in which, in the extending direction (lengthwise direction) of lower electrode layers, a resin portion of a common bump covers an other-side end of the upper electrode layer, an electroconductive layer of a common bump electrically connected to the upper electrode layer is stacked on the resin portion of the common bump at locations that correspond to piezoelectric elements, and the other-side end of the upper electrode layer is formed more to the one side (drive region side) than the other-side end of the electroconductive layer of the common bump.

Furthermore, although in the foregoing exemplary embodiments, ends of the upper electrode layer are covered with resin core bumps connected to the piezoelectric element-side terminals of the wiring substrate, this construction is not restrictive. For example, a construction in which a bump connected to a piezoelectric element-side terminal of a wiring substrate is separately provided, a resin that covers an end of the upper electrode layer is formed separately from the bump, and electrodes electrically connected to the upper electrode layer is disposed on the resin may be adopted. Furthermore, although in the foregoing exemplary embodiments, the lower electrode layers 37 are electrodes formed independently of each other for the individual piezoelectric elements 32 and the upper electrode layer 39 is a common electrode formed continuously over the plurality of piezoelectric elements 32, this construction is not restrictive. It is possible to adopt a construction in which a lower electrode layer is a common electrode formed over a plurality of piezoelectric elements and upper electrode layers are electrodes formed independently of each other for the individual piezoelectric elements. In this construction, the lower electrode layer that is a common electrode is the first electrode layer in the invention and the upper electrode layers that are electrodes are a second electrode layer in the invention. Furthermore, the resin portions of the bumps formed so as to cover ends of the upper electrode layers are a second dielectric layer in the invention and the electroconductive layers of the bumps stacked on the resin portions and the end portions of the upper electrode layer are a third electrode layer. In this case, too, in the extending direction of the upper electrode layers, the ends of the upper electrode layers are formed more to the drive region side than the resin portion-side ends of the electroconductive layers of the bumps. Because of this, the breakage of the piezoelectric layers, the upper electrode layers, etc., caused by leakage current flowing in the ends of the upper electrode layers can be inhibited.

Although the foregoing description has exemplified a construction in which ink, a kind of liquid, is ejected from the nozzles 22 as the piezoelectric elements 32 are driven so that the drive regions 35 in which the piezoelectric elements 32 are formed are displaced, this construction is not restrictive. The invention can be applied to any MEMS device if the MEMS device includes a drive region that has a stacked structural body in which a first electrode layer, a first dielectric layer, and a second electrode layer have been stacked in that order. For example, the invention can also be applied to sensors and the like for detecting pressure changes, vibration, displacement, etc. regarding a drive region. Note that the space that is partially defined by the drive region is not limited to a space in which a liquid passes.

Although the exemplary embodiments have been described above in conjunction with the ink jet type recording head 3 as an example of a liquid ejecting head, the invention is also applicable to other liquid ejecting heads that include a drive region that has a stacked structural body in which a first electrode layer, a piezoelectric layer, and a second electrode layer have been stacked in that order. For example, the invention is also applicable to color material ejecting heads for use in production of color filters for liquid crystal displays and the like, electrode material ejecting heads for use in electrode formation for organic electroluminescence (EL) displays, field emission displays (FED), etc., bioorganic material ejecting heads for use in production biochips (biochemical devices), and so forth. A color material ejecting head for a display production apparatus ejects solutions of various color materials of red (R), green (G), blue (B), etc. as kinds of liquid. Furthermore, an electrode material ejecting head for an electrode forming apparatus ejects an electrode material in a liquid state as a kind of liquid and a bioorganic material ejecting head for a chip production apparatus ejects a solution of a bioorganic material as a kind of liquid.

What is claimed is:

1. A MEMS device comprising
a drive region having a stacked structural body in which a first electrode layer, a first dielectric layer, and a second electrode layer are stacked in that order,
wherein the stacked structural body extends from the drive region to a non-drive region that is outer than the drive region and, in an extending direction of the stacked structural body, the first electrode layer and the first dielectric layer extend farther outward than the second electrode layer, and
wherein a second dielectric layer covering an end of the second electrode layer in the extending direction is stacked on the second electrode layer in the non-drive region and the first dielectric layer that is formed outer in the extending direction than the second electrode layer, and
wherein a third electrode layer electrically connected to the second electrode layer is stacked on the second dielectric layer and on the second electrode layer in a region outside the second dielectric layer, and
wherein, in the extending direction, the end of the second electrode layer is formed more to a drive region side than a second dielectric layer-side end of the third electrode layer.

2. The MEMS device according to claim 1, wherein in a direction orthogonal to a stacking direction of the stacked structural body and orthogonal to the extending direction, a measurement of an overlap of the third electrode layer with the second dielectric layer is larger than a measurement of the first electrode layer.

3. A liquid ejecting head comprising:
the MEMS device according to claim 2;
a pressure chamber that is at least partially defined by the drive region; and
a nozzle that communicates with the pressure chamber,
wherein the first dielectric layer is a piezoelectric layer, and
wherein the second dielectric layer is a resin.

4. A liquid ejecting apparatus comprising the liquid ejecting head according to claim 3.

5. A liquid ejecting head comprising:
the MEMS device according to claim 1;
a pressure chamber that is at least partially defined by the drive region; and
a nozzle that communicates with the pressure chamber,
wherein the first dielectric layer is a piezoelectric layer, and
wherein the second dielectric layer is a resin.

6. A liquid ejecting apparatus comprising the liquid ejecting head according to claim 5.

* * * * *